US011263100B2

(12) United States Patent
Dang

(10) Patent No.: US 11,263,100 B2
(45) Date of Patent: Mar. 1, 2022

(54) TESTING METHOD AND DEVICE TO DETERMINE PROBLEM SOURCE OF SERVER FAILURE

(71) Applicant: ZHENGZHOU YUNHAI INFORMATION TECHNOLOGY CO., LTD., Zhengzhou (CN)

(72) Inventor: Jie Dang, Zhengzhou (CN)

(73) Assignee: ZHENGZHOU YUNHAI INFORMATION TECHNOLOGY CO., LTD., Zhengzhou (CN)

(*) Notice: Subject to any disclaimer, the term of this patent is extended or adjusted under 35 U.S.C. 154(b) by 0 days.

(21) Appl. No.: 17/217,308

(22) Filed: Mar. 30, 2021

(65) Prior Publication Data
US 2021/0216421 A1 Jul. 15, 2021

Related U.S. Application Data

(63) Continuation of application No. PCT/CN2019/098484, filed on Jul. 31, 2019.

(51) Int. Cl.
G06F 11/26 (2006.01)
G01R 31/00 (2006.01)

(52) U.S. Cl.
CPC ............ G06F 11/26 (2013.01); G01R 31/002 (2013.01)

(58) Field of Classification Search
CPC .............................. G06F 11/26; G01R 31/002
See application file for complete search history.

(56) References Cited

U.S. PATENT DOCUMENTS

| 10,551,422 | B2* | 2/2020 | Hiraga | G01R 31/002 |
| 2002/0147553 | A1* | 10/2002 | Shimazaki | G01R 31/2855 |
| | | | | 702/65 |
| 2005/0258842 | A1* | 11/2005 | Maloney | G01R 31/002 |
| | | | | 324/750.26 |
| 2009/0091347 | A1* | 4/2009 | Gohel | G01R 31/31924 |
| | | | | 324/764.01 |
| 2010/0134193 | A1 | 6/2010 | Maede | |

(Continued)

FOREIGN PATENT DOCUMENTS

| CN | 101614582 A | 12/2009 |
| CN | 102084568 A | 6/2011 |
| CN | 105699788 A | 6/2016 |

(Continued)

OTHER PUBLICATIONS

Qian Zhaoming, Wu Xin, Lu Zhengyu and M. H. Pong, "Status of electromagnetic compatibility research in power electronics," Proceedings IPEMC 2000. Third International Power Electronics and Motion Control Conference, 2000, pp. 46-57 vol. 1 (Year: 2000).*

(Continued)

Primary Examiner — Matthew M Kim
Assistant Examiner — Indranil Chowdhury
(74) Attorney, Agent, or Firm — Kolitch Romano LLP

(57) ABSTRACT

This application provides a testing method and a testing device to determine a problem source of a server failure. When a server experiences a failure, one or more than one Electro Magnetic Susceptibility (EMS) tests are performed and the time domain waveforms during an EMS test are compared to determine whether the server failure is related to EMS interference.

20 Claims, 4 Drawing Sheets

(56) References Cited

U.S. PATENT DOCUMENTS

2015/0130477 A1 5/2015 Berland et al.
2017/0223813 A1* 8/2017 Wu .................. G11C 29/56016

FOREIGN PATENT DOCUMENTS

CN 106932764 A 7/2017
CN 109697148 A 4/2019

OTHER PUBLICATIONS

Y. Tian, X. Yang and W. Chen, "A Novel Copper Layer-Based Field-to-Trace Coupling Model and EMS Evaluation Method for DSP-Based Control Circuit in MMC-HVDC System", IEEE Journal of Emerging and Selected Topics in Power Electronics, vol. 9, No. 1, pp. 1133-1146, Feb. 2021 (Year: 2021).*
International Search Report of the International Searching Authority for State Intellectual Property Office of the People's Republic of China in PCT application No. PCT/CN2019/098484 dated Sep. 25, 2019, which is an International application corresponding to this U.S. application.
Yang, Zhizhong, et al.; "Methods of Suppressing Electromagnetic Interference"; China Academic Electronic Automation Equipment, Journal Electronic Publishing House; Nanjing Electric Power Technical College 1006-6047. 1994. 03. 002; Aug. 1994.

* cited by examiner

TESTING METHOD AND DEVICE TO DETERMINE PROBLEM SOURCE OF SERVER FAILURE

This application is a continuation application of international application no. PCT/CN 2019//098484, filed on Jul. 31, 2019 entitled "Testing Method and Device." The international application claims the benefit of Chinese Patent Application No. 201811623823.4 filed to Chinese Patent Office on Dec. 28, 2018 entitled "A testing method and device". Both of these applications are incorporated herein by reference in their entirety.

TECHNICAL FIELD

The present application relates to the computer field, and more particularly to a testing method and device.

BACKGROUND

The time domain is the real world we experience, in which high-speed signals run, and the performance of the signal is usually evaluated in the time domain, because the performance of the product is ultimately measured in the time domain. The representative measuring instrument in the time domain is an oscilloscope. EMS (Electro Magnetic Susceptibility) test items include electrostatic immunity, lightning surge immunity, electrical fast pulse group immunity, power frequency magnetic field immunity, radiation immunity, and conduction immunity etc., EMS items are usually analyzed and measured in the frequency domain. However, it is easier to analyze and describe some problems in the frequency domain than in the time domain, for example, bandwidth is a concept in the frequency domain and can be used to describe the highest effective sine wave frequency component related to signals, measurements, models, or interconnects.

In the prior art, users may encounter problems such as power failure, restart, and data loss when using products. When design engineers analyze these difficult problems, they usually use an oscilloscope to analyze them in the time domain. Some of these difficult problems are often difficult to locate the source in the time domain, and some problems are difficult to reproduce, so we have to analyze product failures from the perspective of EMS.

EMS analysis is performed in the frequency domain. In the frequency domain analysis, what we see is the final measurement results of multiple frequency points in the frequency domain. It is necessary to further analyze which signals generate these measurement results specifically.

It is also difficult to analyze some difficult product failures from the perspective of EMS. The test standard of EMS test is divided into levels, and the test is considered to be passed after passing the corresponding level. However, there are certain situations, even if the test is passed; the malfunction of the product is caused by the actual interference level exceeding the standard level.

SUMMARY

The technical problem to be solved by this application is to provide a testing method and device that can determine whether a server failure is related to EMS interference.

In order to solve the above technical problems, this application provides a testing method, the testing method includes:

when a server experience a failure during use, determining a current suspected problem source; and determining whether the server has passed a first EMS test, and if the server has not passed the first EMS test, performing an operation A;

the operation A includes:

a1. performing a second EMS test on the server;

a2. determining whether the failure disappears during the second EMS test;

a3. if the failure disappears during the second EMS test, performing a4;

a4. obtaining a first time domain waveform and a second time domain waveform;

a5. determining whether the absolute value of the difference between a first oscillation amplitude and a second oscillation amplitude is greater than or equal to a first threshold;

a6. if the absolute value of the difference between the first oscillation amplitude and the second oscillation amplitude is less than the first threshold value, performing a system-level anti-EMS design, and determining whether the failure disappears after performing the system-level anti-EMS design, if the failure disappears after performing the system-level anti-EMS design, determining that the EMS interference is the source of the failure.

Wherein, the level of the second EMS test is lower than the level of the first EMS test, and the first EMS test and the second EMS test are tests in which test points applied to system-level ports.

The first time domain waveform and the second time domain waveform are the time domain waveforms obtained in the last two EMS tests performed before comparing with the first threshold from the current suspected problem source; the first oscillation amplitude is the oscillation amplitude of the first time domain waveform, and the second oscillation amplitude is the oscillation amplitude of the second time domain waveform.

Wherein, the system-level anti-EMS design refers to strengthening the structural grounding continuity design of the EMS test point, strengthening the release of interference, or using the shielding design of the interference path.

Wherein, the system-level ports include power interface, communication interface and chassis shell.

Optionally, after the a5, the operation A further includes:

a7. if the absolute value of the difference between the first oscillation amplitude and the second oscillation amplitude is greater than or equal to the first threshold, performing a board-level anti-EMS design, and determining whether the failure disappears after performing the board-level anti-EMS design, if the failure disappears after performing the board-level anti-EMS design, determining that EMS interference is the source of the failure.

Wherein, the board-level anti-EMS design refers to: the interference discharge protection devices that can be connected in parallel to the known interfered signal, or energy absorption devices that can be connected in series, or using energy isolation devices.

Optionally, the method further includes:

if the failure does not disappear after performing the system-level anti-EMS design, determining that EMS interference is not the source of the failure;

if the failure does not disappear after performing the board-level anti-EMS design, determining that EMS interference is not the source of the failure.

Optionally, the method further includes:

if the server has passed the first EMS test, performing a third EMS test on the server, and determining whether the failure is replicated during the third EMS test, and if the failure is replicated during the third EMS test, performing the operation A from the a1;

Wherein, the level of the third EMS test is higher than the level of the first EMS test; and the third EMS test is a test in which the test point is applied to the system-level port.

Optionally, the method further includes:

if the failure is not replicated during the third EMS test, performing a fourth EMS test at the current suspected problem source, and performing operation B;

the operation B includes:

b1. determining whether the failure is replicated during the fourth EMS test currently being performed; and b2. if the failure is replicated during the fourth EMS test currently being performed, start performing the operation A from the a4.

The fourth EMS test is a non-system level test in which the test point is applied to a board-level port. Wherein, the board-level port includes a connector, a chip, and a circuit.

Optionally, after the b1, operation B further includes:

b3. if the failure is not replicated during the fourth EMS test currently being performed, obtaining a third time domain waveform and a fourth time domain waveform;

b4. determining whether the absolute value of the difference between a third oscillation amplitude and a fourth oscillation amplitude is greater than or equal to a second threshold;

b5. if the absolute value of the difference between the third oscillation amplitude and the fourth oscillation amplitude is greater than or equal to the second threshold, determining whether there are other suspected problem sources other than the current suspected problem source; and b6. if there is no other suspected problem source other than the current suspected problem source, determining that EMS interference is not the source of the failure.

Wherein, the third time domain waveform and the fourth time domain waveform are the time domain waveforms obtained in the last two EMS tests performed before comparing with the second threshold from the current suspected problem source; the third oscillation amplitude is the oscillation amplitude of the third time domain waveform, the fourth oscillation amplitude is the oscillation amplitude of the fourth time domain waveform, the third oscillation amplitude corresponding to the third time-domain waveform is lower than the fourth oscillation amplitude corresponding to the fourth time-domain waveform.

Optionally, after the b4, the operation B further includes:

b7. if the absolute value of the difference between the third oscillation amplitude and the fourth oscillation amplitude is less than the second threshold, performing the fourth EMS test again at the current suspected problem source, and performing the operation B from the b1.

Optionally, after the b5, the operation B further comprises:

b8. if there are other suspected problem sources other than the current suspected problem source, updating the other suspected problem sources as the current suspected problem source, and performing the fourth EMS test at the updated current suspected problem source, and performing the operation B from the b1.

Optionally, after the a2, the operation A further includes:

if the failure does not disappear during the second EMS test, start performing the operation B from the b1.

The present application also provides a testing device, comprising: a memory and a processor; the memory is used to store a program for testing;

the processor is configured to read and perform the program for testing, and perform the following operations:

when a server experience a failure during use, determining a current suspected problem source; and determining whether the server has passed a first EMS test, and if the server has not passed the first EMS test, perform an operation A;

the operation A includes:

a2. determine a second EMS test on the server;

a2. determining whether the failure disappears during the second EMS test;

a3. if the failure disappears during the second EMS test, performing a4;

a4. obtaining a first time domain waveform and a second time domain waveform;

a5. determining whether the absolute value of the difference between a first oscillation amplitude and a second oscillation amplitude is greater than or equal to a first threshold;

a6. if the absolute value of the difference between the first oscillation amplitude and the second oscillation amplitude is less than the first threshold value, performing a system-level anti-EMS design, and determining whether the failure disappears after performing the system-level anti-EMS design, and if the failure disappears after performing the system-level anti-EMS design, determining that the EMS interference is the source of the failure.

Wherein, the level of the second EMS test is lower than the level of the first EMS test, and the first EMS test and the second EMS test are tests in which test points applied to system-level ports.

The first time domain waveform and the second time domain waveform are the time domain waveforms obtained in the last two EMS tests performed before comparing with the first threshold from the current suspected problem source; the first oscillation amplitude is the oscillation amplitude of the first time domain waveform, and the second oscillation amplitude is the oscillation amplitude of the second time domain waveform.

Wherein, the system-level anti-EMS design refers to: strengthening the structural grounding continuity design of the EMS test point, strengthening the release of interference, or using the shielding design of the interference path.

Wherein, the system-level ports include power interface, communication interface and chassis shell.

Optionally, after the a5, the operation A further includes:

a7. if the absolute value of the difference between the first oscillation amplitude and the second oscillation amplitude is greater than or equal to the first threshold, performing a board-level anti-EMS design, and determining whether the failure disappears after performing the board-level anti-EMS design, and if the failure disappears after performing the board-level anti-EMS design, determining that EMS interference is the source of the failure.

Wherein, the board-level anti-EMS design refers to: the interference discharge protection devices that can be connected in parallel to the known interfered signal, or energy absorption devices that can be connected in series, or using energy isolation devices.

Optionally, the processor is configured to read and perform the program for testing, and further performs the following operations:

if the failure does not disappear after performing the system-level anti-EMS design, determining that EMS interference is not the source of the failure;

if the failure does not disappear after performing the board-level anti-EMS design, determining that EMS interference is not the source of the failure.

Optionally, the processor is configured to read and perform the program for testing, and further performs the following operations:

if the server has passed the first EMS test, performing a third EMS test on the server, and determining whether the failure is replicated during the third EMS test, and if the failure is replicated during the third EMS test, performing the operation A from the a1.

Wherein, the level of the third EMS test is higher than the level of the first EMS test; and the third EMS test is a test in which the test point is applies to the system-level port.

Optionally, the processor is configured to read and perform the program for testing, and further perform the following operations:

if the failure is not replicated during the third EMS test, performing a fourth EMS test at the current suspected problem source, and performing operation B;

the operation B includes:

b1. determining whether the failure is replicated during the fourth EMS test currently being performed; and b2. if the failure is replicated during the fourth EMS test currently being performed, performing the operation A from the a4.

The fourth EMS test is a non-system level test in which the test point is applied to a board-level port. Wherein, the board-level port includes a connector, a chip, and a circuit.

Optionally, after the b1, operation B further includes:

b3. if the failure is not replicated during the fourth EMS test currently being performed, obtaining a third time domain waveform and a fourth time domain waveform;

b4. determining whether the absolute value of the difference between a third oscillation amplitude and a fourth oscillation amplitude is greater than or equal to a second threshold;

b5. if the absolute value of the difference between the third oscillation amplitude and the fourth oscillation amplitude is greater than or equal to the second threshold, determining whether there are other suspected problem sources other than the current suspected problem source; and b6. if there is no other suspected problem source other than the current suspected problem source, determining that EMS interference is not the source of the failure.

Wherein, the third time domain waveform and the fourth time domain waveform are the time domain waveforms obtained in the last two EMS tests performed before comparing with the second threshold from the current suspected problem source; and the third oscillation amplitude is the oscillation amplitude of the third time domain waveform, and the fourth oscillation amplitude is the oscillation amplitude of the fourth time domain waveform, the third oscillation amplitude corresponding to the third time-domain waveform is lower than the fourth oscillation amplitude corresponding to the fourth time-domain waveform.

Optionally, after the b4, operation B further includes:

b7. if the absolute value of the difference between the third oscillation amplitude and the fourth oscillation amplitude is less than the second threshold, performing the fourth EMS test again at the current suspected problem source, and performing the operation B from the b1.

Optionally, after the b5, operation B further includes:

b8. if there are other suspected problem sources other than the current suspected problem source, updating the other suspected problem sources as the current suspected problem source, and performing the fourth EMS test at the updated current suspected problem source, and performing the operation B from the b1.

Optionally, after the a2, the operation A further includes:

if the failure does not disappear during the second EMS test, start performing the operation B from the b1.

Compared with the prior art, this application includes: when the server experience a failure during use, determining a current suspected problem source; determining whether the server has passed a first EMS test, and if the server has not passed the first EMS test, performing an operation A; the operation A includes: a1. performing a second EMS test on the server; a2. determining whether the failure disappears during the second EMS test; a3. if the failure disappears during the second EMS test, performing a4; a4. obtaining a first time domain waveform and a second time domain waveform; a5. determining whether the absolute value of the difference between a second oscillation amplitude and a first oscillation amplitude is greater than or equal to a first threshold; a6. if the absolute value of the difference between the first oscillation amplitude and the second oscillation amplitude is less than the first threshold value, performing a system-level anti-EMS design, and determining whether the failure disappears after performing the system-level anti-EMS design, if the failure disappears after performing the system-level anti-EMS design, determining that the EMS interference is the source of the failure; wherein, the level of the second EMS test is lower than the level of the first EMS test, and the first EMS test and the second EMS test are tests that apply test points to system-level ports; the first time domain waveform and the second time domain waveform are the time domain waveforms obtained in the last two EMS tests performed before comparing with the first threshold from the current suspected problem source; the first oscillation amplitude is the oscillation amplitude of the first time domain waveform, and the second oscillation amplitude is the oscillation amplitude of the second time domain waveform. Through the above technical solution, it can be determined whether the server failure is related to EMS interference.

DETAILED DESCRIPTION

Figure 1:
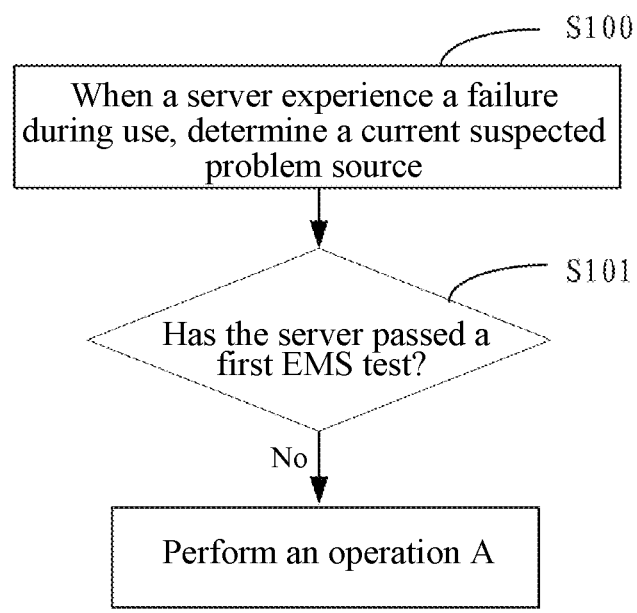
FIG. 1 is a flowchart of a testing method according to an embodiment of the present disclosure.

In order to make the objectives, technical solutions and advantages of the present disclosure clearer, the embodiments of the present disclosure will be described in detail below with reference to the accompanying drawings. It should be noted that the embodiments in the application and the features in the embodiments can be combined with each other arbitrarily if there is no conflict.

The steps shown in the flowchart of the drawings may be performed in a computer system such as a set of computer-executable instructions. And, although a logical sequence is shown in the flowchart, in some cases, the steps shown or described may be performed in a different order than here.

Before describing the technical solution of the present application, the terms involved are introduced.

The concept and comparison method of product failure phenomenon and EMS phenomenon.

After long-term work, server products sold to customers sometimes experience power failures, restarts, data loss, and board card parts burnout, which are called product failure phenomenon.

During the EMS test, the product to be tested sometimes has phenomena such as power failure, restart, data loss, and burnout of board components, which are called EMS phenomenon.

EMS testing device includes an electrostatic gun, a surge tester, an electric fast pulse group tester, etc.

2) Concepts of Suspected Problem Source, Failure Time Domain Waveform, and EMS Time Domain Waveform, and Comparative Analysis Method After the product fails, the engineer will first perform time domain measurement and troubleshooting to check whether there is an abnormality in the critical power supply and signal when the problem occurs. When an abnormal time domain waveform is measured, the abnormal time domain waveform is called the failure time domain waveform. For example, the power signal of a power board is disturbed, the power signal of the power board is called a suspected time domain problem source.

The reason why it is called a suspected problem source is that the problem source is not necessarily accurate, which is mentioned in the following embodiments. The problem source may be the ultimate source of the failure; or not be the ultimate source of the failure, but only the direct cause. Therefore, we have to figure out why the signal is abnormal, and determine the accurate ultimate source of the failure. Only when the accurate ultimate source of the failure is determined, can the failure problem be finally solved.

During the EMS test, abnormal waveforms are also measured at the suspected problem source, so the abnormal waveform at this time is called the EMS time domain waveform. The method of comparing and analyzing the failure time domain waveform and the EMS time domain waveform will be further elaborated in the embodiments.

The measurement methods and precautions of EMS time domain waveforms include the following:

First, the energy of the EMS is generally very high. Therefore, a product with a high range should be chosen when choosing an oscilloscope, and a high-voltage probe should be chosen when choosing a probe.

Secondly, the measurement point can be any point on the interference path, but it should be noted that if the measurement point is too close to the EMS test point, a risk of exceeding the range would exist. If the measurement point is too far away from the EMS test point, obvious interference signal may not be measured.

3) The Concept and Method of Non-System Level EMS Interference Test

The standard stipulates that EMS test points should be applied to system-level ports, such as power interface, communication interface or chassis shell, which is called system-level EMS test.

Therefore, non-system-level EMS test is a test in which test points is applied to non-system-level board-level ports, such as a certain connector, a certain chip, or a certain circuit, in order to perform a certain verification.

The methods and precautions for non-system level EMS test include:

First, the EMS level should not be too high. It is best to start with the lowest level of the test equipment, such as the 500V of the electrostatic gun, because of the lack of the discharge of the system level of the product, the interference energy should be reduced.

Second, the selection of EMS test points should ensure that the EMS test points are away from sensitive chips in the case where the failure phenomenon can be replicated maximally, so as to prevent waste of test resources.

Third, the selection of EMS test points should ensure that the energy from the test instrument does not exceed the range of the oscilloscope in the case where the failure phenomenon is replicated maximally, so as to prevent inaccurate measurement and even damage to the instrument.

4) System Enhanced EMS Test

System-enhanced EMS test refers to: EMS test is divided into intensity levels, such as static electricity 4 KV (kilovolt, voltage unit), 6 KV, 8 KV. Some standards will stipulate the level of the products to be tested, and the test can be declared passed after passing this level of testing. For example, 4 KV of contact electrostatic. But for some kind of verification, the EMS test level may need to be increased, such as increasing the contact electrostatic to 8 KV. This EMS test is called system-enhanced EMS test.

5) Board-Level EMS Design and System-Level EMS Design

The board-level anti-EMS design refers to: the interference discharge protection devices such as capacitors, TVS, gas discharge tubes, etc. can be connected in parallel to the known interfered signal, or energy absorption devices such as resistors and magnetic beads can be connected in series, or using energy isolation devices such as transformers.

The system-level anti-EMS design refers to: strengthening the structural grounding continuity design of the EMS test point, strengthening the release of interference, or using the shielding design of the interference path, including increasing the distance between the EMS test point and the product sensitive point, etc. The system-level anti-EMS design is to reduce the ground impedance value from the EMS test point to the ground, thereby enhancing the release of interference, and on the release path, preventing its interference to surrounding signals.

Based on the above concept, this application combines the time domain measurement and frequency domain analysis of EMS, distinguishes board-level and system-level EMS design, clarifies/identify the difference between EMS phenomenon and general product failure phenomenon, and designs a location process of the product failure EMS interference source investigation, thus improving the ability and efficiency of product failure analysis. The board-level anti-EMS design is a series of design methods: the design method is to connect the interference bleed protection device in parallel to the ground on the determined interfered signal, such as TVS (Transient Voltage Suppressor), or use energy absorbing devices in series on the signal, such as varistor, or use energy isolation devices, such as isolation transformers.

As shown in FIG. 1, this embodiment provides a testing method, which includes:

step S100, when a server experiences a failure during use, determining a current suspected problem source; and step S101: determining whether the server has passed a first EMS test, and if the server has not passed the first EMS test, performing an operation A.

Figure 2:
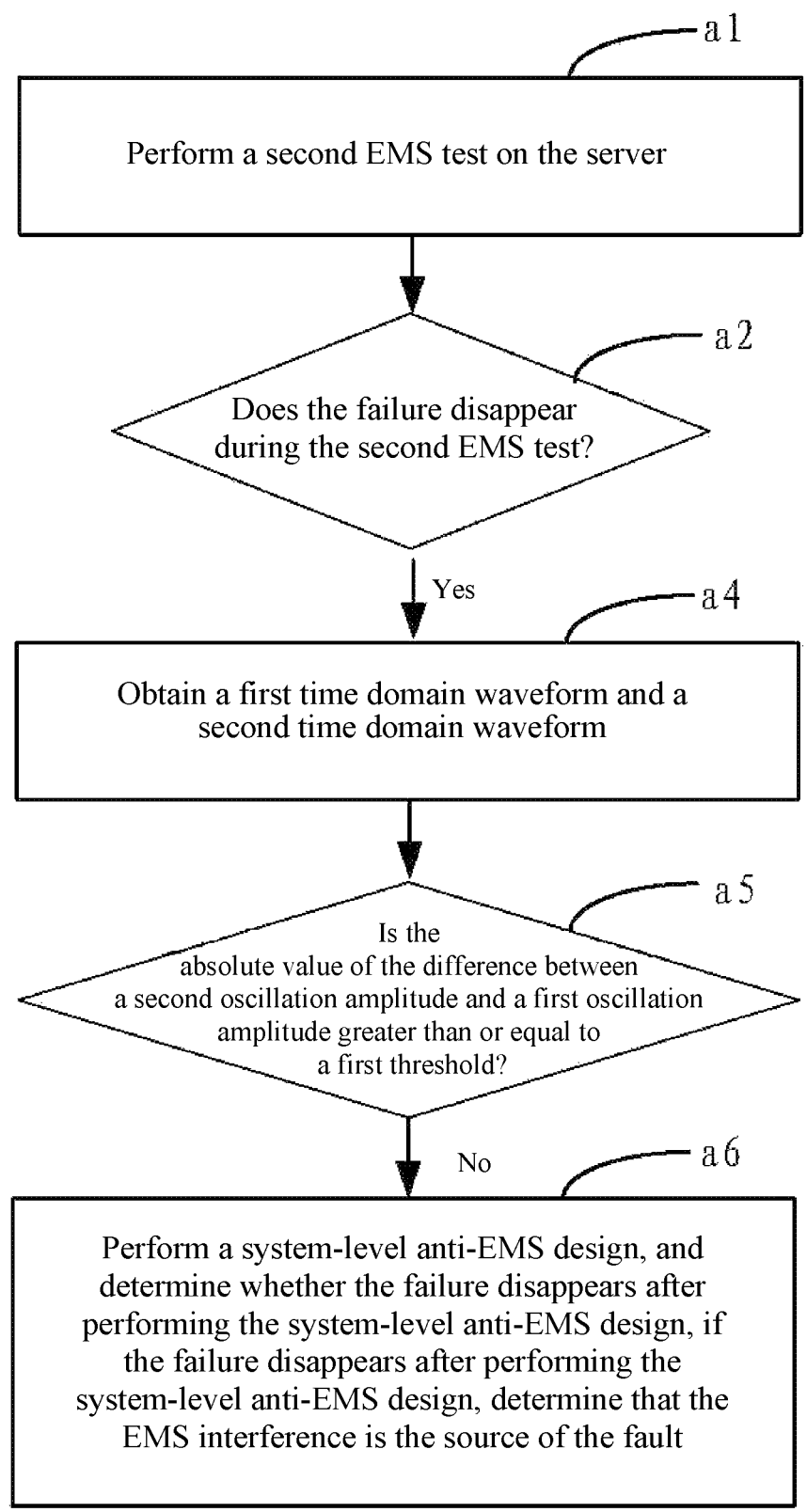
FIG. 2 is a flowchart of operation A of an embodiment of the embodiment of the present disclosure.

An example of the operation A is illustrated in FIG. 2. As shown in FIG. 2, the operation A includes:

a1. performing a second EMS test on the server;

a2. determining whether the failure disappears during the second EMS test;

a3. if the failure disappears during the second EMS test, performing a4;

a4. obtaining a first time domain waveform and a second time domain waveform;

a5. determining whether the absolute value of the difference between a first oscillation amplitude and a second oscillation amplitude is greater than or equal to a first threshold; and a6. if the absolute value of the difference between the first oscillation amplitude and the second oscillation amplitude is less than the first threshold value, performing a system-level anti-EMS design, and determining whether the failure disappears after performing the system-level anti-EMS design, and if the failure disappears after performing the system-level anti-EMS design, determining that the EMS interference is the source of the failure.

Wherein, the level of the second EMS test is lower than the level of the first EMS test, and the first EMS test and the second EMS test are tests in which test points are applied to system-level ports.

The first time domain waveform and the second time domain waveform are the time domain waveforms obtained in the last two EMS tests performed before comparing with the first threshold from the current suspected problem source; the first oscillation amplitude is the oscillation amplitude of the first time domain waveform, and the second oscillation amplitude is the oscillation amplitude of the second time domain waveform.

Wherein, the system-level anti-EMS design refers to: strengthening the structural grounding continuity design of the EMS test point, strengthening the release of interference, or using the shielding design of the interference path.

Wherein, the system-level ports include power interface, communication interface and chassis shell.

In this embodiment, the first EMS test can be a standard EMS test. For example, a standard EMS test of a corresponding level can be set for the server. Taking static electricity as an example, the first EMS test can be tested at 6 kV (voltage unit). The second EMS test may be a test with a level lower than the first EMS test. Also taking static electricity as an example, the second EMS test may be a test at 4 kV or 2 kV.

In this embodiment, the last two EMS tests performed refer to the last two tests among all EMS tests currently performed by the server. The first time domain waveform can be set as the time domain waveform obtained in the penultimate EMS test, and the second time domain waveform can be set as the time domain waveform obtained in the last EMS test. The first time domain waveform can also be set as the time domain waveform obtained in the last EMS test, and the second time domain waveform can also be set as the time domain waveform obtained in the penultimate EMS test.

For example, if the EMS test performed currently by the server includes the failed standard EMS test and the second EMS test performed before the failure, then the first time domain waveform can be set as the waveform obtained in the failed standard EMS test from the current suspected problem source, and the second time domain waveform can be set as the time domain waveform obtained in the second EMS test from the current suspected problem source.

If the EMS test performed currently by the server includes the passed standard EMS test, the third EMS test, and the fourth EMS test (see below) that were performed before the failure, then the first time domain waveform can be set as the time domain waveform obtained in the third EMS test from the current suspected problem source, and the second time domain waveform can be set as the time domain waveform obtained in the fourth EMS test by the current suspected problem source.

Optionally, after the a5, the operation A may further include:

a7. if the absolute value of the difference between the first oscillation amplitude and the second oscillation amplitude is greater than or equal to the first threshold, performing a board-level anti-EMS design, and determining whether the failure disappears after performing the board-level anti-EMS design, and if the failure disappears after performing the board-level anti-EMS design, determining that EMS interference is the source of the failure.

Wherein, the board-level anti-EMS design refers to the interference discharge protection devices that can be connected in parallel to the known interfered signal, or energy absorption devices that can be connected in series to the known interfered signal, or using energy isolation devices.

The first threshold can be set according to specific conditions. If the absolute value of the difference between the first oscillation amplitude and the second oscillation amplitude is greater than or equal to the first threshold, which means that the two time domain waveforms have not changed significantly, the current suspected problem source is not located accurately; and if the absolute value of the difference between the first oscillation amplitude and the second oscillation amplitude is smaller than the first threshold, which means that the oscillation amplitude of the time domain waveform acquired last time is significantly lower than that of the time domain waveform acquired previous time, the current suspected problem source is located accurately.

Optionally, the method may further include:

if the failure does not disappear after performing the system-level anti-EMS design, determining that EMS interference is not the source of the failure;

if the failure does not disappear after performing the board-level anti-EMS design, determining that EMS interference is not the source of the failure.

Optionally, the method may further include:

if the server has passed the first EMS test, performing a third EMS test on the server, and determining whether the failure is replicated during the third EMS test, and if the failure is replicated during the third EMS test, performing operation A starting from the a1.

Wherein, the level of the third EMS test is higher than the level of the first EMS test; the third EMS test is a test in which the test point is applied to a system-level port.

In this embodiment, the third EMS test may be an enhanced test compared to the first EMS test level. Also taking static electricity as an example, the third EMS test may be performed at 8 kV or 10 kV.

Optionally, the method may further include:

if the failure is not replicated during the third EMS test, performing a fourth EMS test at the current suspected problem source, and performing an operation B;

the operation B includes:

b1. determining whether the failure is replicated during the fourth EMS test currently being performed; and b2. if the failure is replicated during the fourth EMS test currently being performed, performing the operation A starting from the a4.

The fourth EMS test is a non-system level test applied to a board-level port by the test point.

In this embodiment, the first EMS test, the second EMS test, and the third EMS test are system-level tests, and the fourth EMS test is a non-system-level test.

Optionally, after the b1, the operation B may further include:

b3. if the failure is not replicated during the fourth EMS test currently being performed, obtaining a third time domain waveform and a fourth time domain waveform;

b4. determining whether the absolute value of the difference between a third oscillation amplitude and a fourth oscillation amplitude is greater than or equal to a second threshold;

b5. if the absolute value of the difference between the third oscillation amplitude and the fourth oscillation amplitude is greater than or equal to the second threshold, determining whether there are other suspected problem sources other than the current suspected problem source; and b6. if there is no other suspected problem source other than the current suspected problem source, determining that EMS interference is not the source of the failure.

Wherein, the third time domain waveform and the fourth time domain waveform are the time domain waveforms obtained in the last two EMS tests performed before comparing with the second threshold from the current suspected problem source; and the third oscillation amplitude is the oscillation amplitude of the third time domain waveform, the fourth oscillation amplitude is the oscillation amplitude of the fourth time domain waveform, the third oscillation amplitude corresponding to the third time-domain waveform is lower than the fourth oscillation amplitude corresponding to the fourth time-domain waveform.

Optionally, after the b4, the operation B may further include:

b7. if the absolute value of the difference between the third oscillation amplitude and the fourth oscillation amplitude is less than the second threshold, performing the fourth EMS test again at the current suspected problem source, and performing the operation B starting from the b1.

The second threshold can be set according to specific circumstances. If the absolute value of the difference between the third oscillation amplitude and the fourth oscillation amplitude is greater than or equal to the second threshold, the current suspected problem source is not located accurately.

Optionally, after the b5, the operation B may further include:

b8. if there are other suspected problem sources other than the current suspected problem source, updating the other suspected problem sources as the current suspected problem source, and performing the fourth EMS test at the updated current suspected problem source, and performing the operation B starting from the b1.

Optionally, after the a2, the operation A may further include:

if the failure does not disappear during the second EMS test, performing the operation B starting from the b1;

wherein, the third oscillation amplitude corresponding to the third time-domain waveform is lower than the fourth oscillation amplitude corresponding to the fourth time-domain waveform.

By comparing the time domain waveforms during the EMS test, the method and device of the present application can determine whether the server failure is related to EMS interference, thereby improving the ability and efficiency of product failure analysis.

Figure 3:
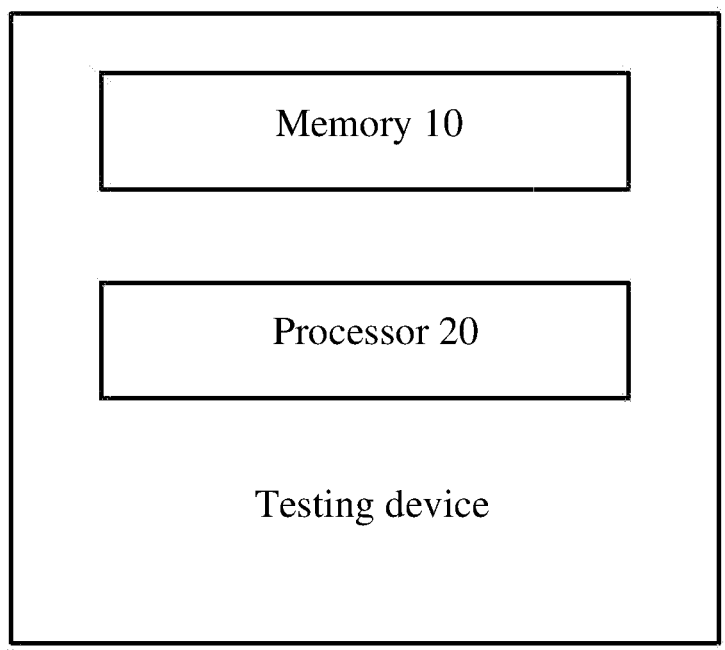
FIG. 3 is a schematic structural diagram of a testing device according to an embodiment of the present disclosure.

As shown in FIG. 3, the embodiment of the present disclosure also provides a testing device, including: a memory 10 and a processor 20;

the memory 10 is used to store a program for testing;

the processor 20 is configured to read and perform the program for testing, and perform the following operations:

when a server experience a failure during use, determining a current suspected problem source;

determining whether the server has passed a first EMS test, and if the server has not passed the first EMS test, performing an operation A.

The operation A includes:

a1. performing a second EMS test on the server;

a2. determining whether the failure disappears during the second EMS test;

a3. if the failure disappears during the second EMS test, performing a4;

a4. obtaining a first time domain waveform and a second time domain waveform;

a5. determining whether the absolute value of the difference between a first oscillation amplitude and a second oscillation amplitude is greater than or equal to a first threshold;

a6. if the absolute value of the difference between the first oscillation amplitude and the second oscillation amplitude is less than the first threshold value, performing a system-level anti-EMS design, and determining whether the failure disappears after performing the system-level anti-EMS design, and if the failure disappears after performing the system-level anti-EMS design, determining that the EMS interference is the source of the failure.

Wherein, the level of the second EMS test is lower than the level of the first EMS test, and the first EMS test and the second EMS test are tests in which test points are applied to system-level ports.

The first time domain waveform and the second time domain waveform are the time domain waveforms obtained in the last two EMS tests performed before comparing with the first threshold from the current suspected problem source; the first oscillation amplitude is the oscillation amplitude of the first time domain waveform, and the second oscillation amplitude is the oscillation amplitude of the second time domain waveform.

Wherein, the system-level anti-EMS design refers to: strengthening the structural grounding continuity design of the EMS test point, strengthening the release of interference, or using the shielding design of the interference path.

Wherein, the system-level ports include power interface, communication interface and chassis shell.

Optionally, after the a5, the operation A may further include:

a7. if the absolute value of the difference between the first oscillation amplitude and the second oscillation amplitude is greater than or equal to the first threshold, performing a board-level anti-EMS design, and determining whether the failure disappears after performing the board-level anti-EMS design, if the failure disappears after performing the board-level anti-EMS design, determining that EMS interference is the source of the failure.

Wherein, the board-level anti-EMS design refers to: the interference discharge protection devices that can be connected in parallel to the known interfered signal, or energy absorption devices that can be connected in series, or using energy isolation devices.

Optionally, the processor 20 is configured to read and perform the program for testing, and further performs the following operations:

if the failure does not disappear after performing the system-level anti-EMS design, determining that EMS interference is not the source of the failure;

if the failure does not disappear after performing the board-level anti-EMS design, determining that EMS interference is not the source of the failure.

Optionally, the processor 20 is configured to read and perform the program for testing, and further performs the following operations:

if the server has passed the first EMS test, performing a third EMS test on the server, and determining whether the failure is replicated during the third EMS test, and if the failure is replicated during the third EMS test, start performing operation A starting from the a1.

Wherein, the level of the third EMS test is higher than the level of the first EMS test; and the third EMS test is a test in which the test point is applied to a system-level port.

Optionally, the processor 20 is configured to read and perform the program for testing, and further perform the following operations:

if the failure is not replicated during the third EMS test, performing a fourth EMS test at the current suspected problem source, and performing an operation B.

The operation B includes:

b1. determining whether the failure is replicated during the fourth EMS test currently being performed; and b2. if the failure is replicated during the fourth EMS test currently being performed, performing the operation A from the a4;

the fourth EMS test is a non-system level test in which the test point is applied to a board-level port. Wherein, the board-level port includes a connector, a chip, and a circuit.

Optionally, after the b1, the operation B may further include:

b3. if the failure is not replicated during the fourth EMS test currently being performed, obtaining a third time domain waveform and a fourth time domain waveform;

b4. determining whether the absolute value of the difference between a third oscillation amplitude and a fourth oscillation amplitude is greater than or equal to a second threshold;

b5. if the absolute value of the difference between the third oscillation amplitude and the fourth oscillation amplitude is greater than or equal to the second threshold, determining whether there are other suspected problem sources other than the current suspected problem source; and b6. if there is no other suspected problem source other than the current suspected problem source, determining that EMS interference is not the source of the failure.

Wherein, the third time domain waveform and the fourth time domain waveform are the time domain waveforms obtained in the last two EMS tests performed before comparing with the second threshold from the current suspected problem source; the third oscillation amplitude is the oscillation amplitude of the third time domain waveform, and the fourth oscillation amplitude is the oscillation amplitude of the fourth time domain waveform, the third oscillation amplitude corresponding to the third time-domain waveform is lower than the fourth oscillation amplitude corresponding to the fourth time-domain waveform.

Optionally, after the b4, the operation B may further include:

b7. if the absolute value of the difference between the third oscillation amplitude and the fourth oscillation amplitude is less than the second threshold, performing the fourth EMS test again at the current suspected problem source, and performing the operation B starting from the b1.

Optionally, after the b5, the operation B may further include:

b8. if there are other suspected problem sources other than the current suspected problem source, updating the other suspected problem sources as the current suspected problem source, and performing the fourth EMS test at the updated current suspected problem source, and performing the operation B from the b1.

Optionally, after the a2, the operation A may further include:

if the failure does not disappear during the second EMS test, performing the operation B starting from the b1;

wherein, the third oscillation amplitude corresponding to the third time-domain waveform is lower than the fourth oscillation amplitude corresponding to the fourth time-domain waveform.

By comparing the time domain waveforms during the EMS test, the method and device of this application can determine whether the server failure is related to EMS interference, thereby improving the ability and efficiency of product failure analysis.

Figure 4:
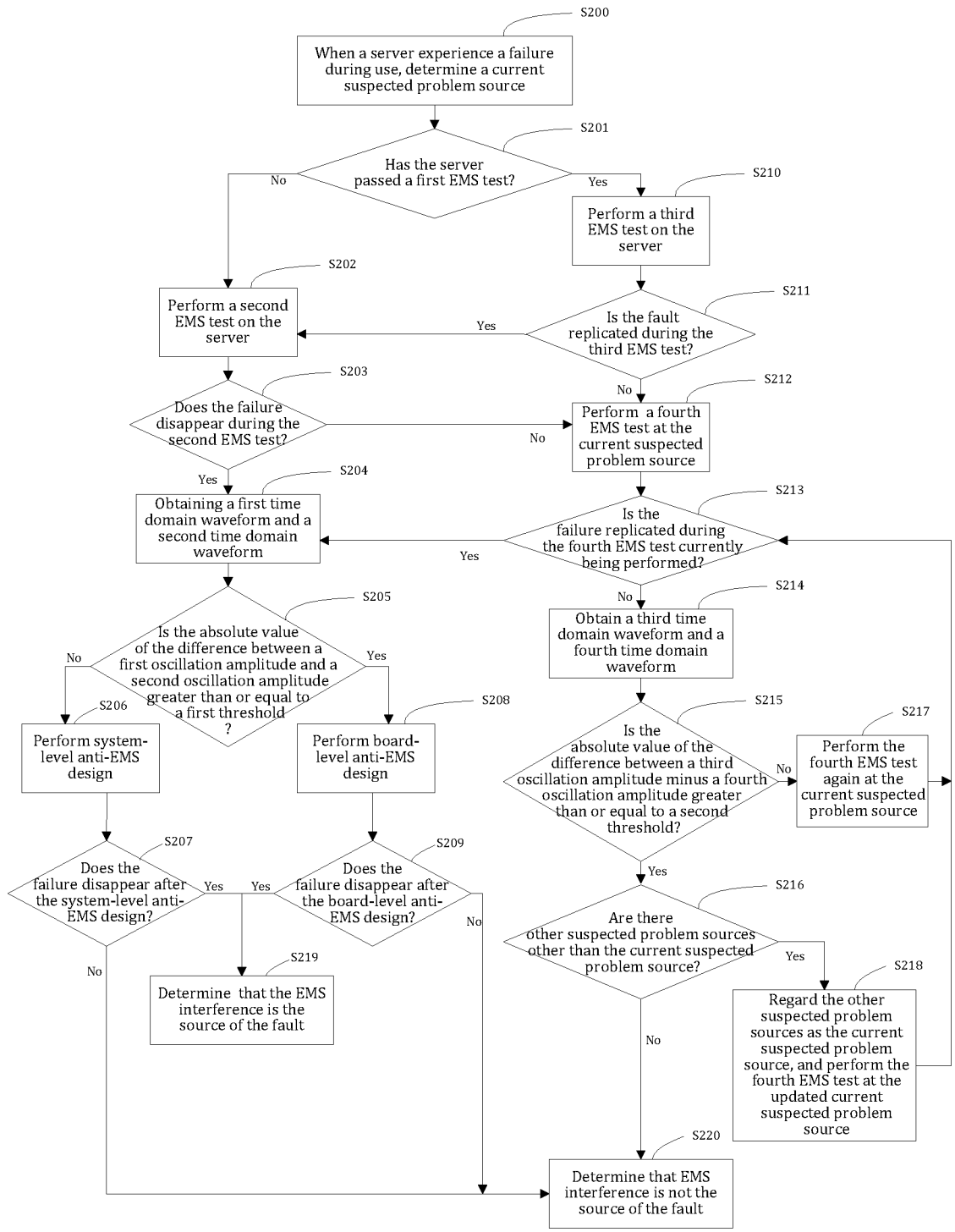
FIG. 4 is a flowchart of a testing method according to an example of the embodiments of the present disclosure.

The testing method of the present application is further explained by specific examples as illustrated in FIG. 4. The testing method for this example includes:

Step S200, when a server experience a failure during use, determining a current suspected problem source.

Step S201: determining whether the server has passed a first EMS test, if the server has not passed the first EMS test, performing step S202; and if the server has passed the first EMS test, performing Step S210.

Step S202: performing a second EMS test on the server.

Step S203: determining whether the failure disappears during the second EMS test; if the failure disappears during the second EMS test, performing step S204; if the failure does not disappear during the second EMS test, then turning to step S212.

Step S204: obtaining a first time domain waveform and a second time domain waveform.

Step S205: determining whether the absolute value of the difference between a first oscillation amplitude and a second oscillation amplitude is greater than or equal to a first threshold; if the absolute value of the difference between the first oscillation amplitude and the second oscillation amplitude is less than the first threshold value, performing step S206; if the absolute value of the difference between the first oscillation amplitude and the second oscillation amplitude is greater than or equal to the first threshold, performing step S208.

Step S206: performing system-level anti-EMS design.

Step S207: determining whether the failure disappears after performing the system-level anti-EMS design, if the failure disappears after performing the system-level anti-EMS design, performing step S219; if the failure does not disappear after performing the system-level anti-EMS design, performing step S220.

In this embodiment, the level of the second EMS test is lower than the level of the first EMS test, and the first EMS test and the second EMS test are tests in which test points are applied to system-level ports.

The first time domain waveform and the second time domain waveform are the time domain waveforms obtained in the last two EMS tests performed before comparing with the first threshold from the current suspected problem source; the first oscillation amplitude is the oscillation amplitude of the first time domain waveform, and the second oscillation amplitude is the oscillation amplitude of the second time domain waveform.

Wherein, the system-level anti-EMS design refers to: strengthening the structural grounding continuity design of the EMS test point, strengthening the release of interference, or using the shielding design of the interference path.

Wherein, the system-level ports include power interface, communication interface and chassis shell.

Upon determination that the absolute value of the difference between a first oscillation amplitude and a second oscillation amplitude is greater than the first threshold from step 205, the method goes to step S208, performing board-level anti-EMS design.

Step S209: determining whether the failure disappears after performing the board-level anti-EMS design, if the failure disappears after performing the board-level anti-EMS design, performing step S219; and if the failure does not disappear after performing the board-level anti-EMS design, performing step S220.

Upon determination that the server has passed the first EMS test from step 201, the method goes to step S210: Performing a third EMS test on the server.

Step S211: determining whether the failure is replicated during the third EMS test, if the failure is replicated during the third EMS test, turning to step S202; and if the failure is not replicated during performing the third EMS test, performing step S212.

In this embodiment, the level of the third EMS test is higher than the level of the first EMS test; and the third EMS test is a test in which the test point is applied to a system-level port.

Step S212: performing a fourth EMS test at the current suspected problem source.

Step S213: determining whether the failure is replicated during the fourth EMS test currently being performed; if the failure is replicated during the fourth EMS test currently being performed, turning to step S204; and if the failure is not replicated during the fourth EMS test currently being performed, performing step S214.

In this embodiment, the fourth EMS test is a non-system level test in which the test point is applied to a board-level port. Wherein, the board-level port includes a connector, a chip, and a circuit.

Step S214: obtaining a third time domain waveform and a fourth time domain waveform.

Step S215: determining whether the absolute value of the difference between a third oscillation amplitude and a fourth oscillation amplitude is greater than or equal to a second threshold; if the absolute value of the difference between the third oscillation amplitude and the fourth oscillation amplitude is greater than or equal to the second threshold, performing step S216; and if the absolute value of the difference between the third oscillation amplitude and the fourth oscillation amplitude is less than the second threshold, performing step S217.

Step S216: determining whether there are other suspected problem sources other than the current suspected problem source; if there is no other suspected problem source other than the current suspected problem source, performing step S220; if there are other suspected problem sources other than the current suspected problem source, performing step S218.

In this embodiment, the third time domain waveform and the fourth time domain waveform are the time domain waveforms obtained in the last two EMS tests performed before comparing with the second threshold from the current suspected problem source; the third oscillation amplitude is the oscillation amplitude of the third time domain waveform, and the fourth oscillation amplitude is the oscillation amplitude of the fourth time domain waveform, the third oscillation amplitude corresponding to the third time-domain waveform is lower than the fourth oscillation amplitude corresponding to the fourth time-domain waveform.

Step S217: performing the fourth EMS test again at the current suspected problem source, and turning to step S213.

Upon the determination that there are other suspected problem sources other than the current suspected problem source at step 216, the method goes to step S218: updating the other suspected problem sources as the current suspected problem source, and performing the fourth EMS test at the updated current suspected problem source, and turning to step S213.

Step S219: determining that the EMS interference is the source of the failure, and the end.

Step S220: determining that EMS interference is not the source of the failure, and the end.

The embodiments of the present disclosure provide a testing method and device. When a server experience a failure, time domain waveforms during an EMS test are compared so that it can be determined whether the server failure is related to EMS interference.

According to another aspect, a testing device is provided to determine a problem source of a server failure via one or more Electro Magnetic Susceptibility (EMS) test. The testing device, comprises a memory to store a program for testing; and a processor configured to run the program stored on the memory to perform the following steps: receiving a first EMS test result from an EMS testing device in response to the server failure; and determining whether the server has passed the first EMS test; in response to a determination that the server has not passed the first EMS test, instructing the EMS testing device to perform a second EMS test on the server; determining whether the failure disappears during the second EMS test; in response to a determination that the failure disappears during the second EMS test, obtaining a first time domain waveform and a second time domain waveform, determining whether an absolute value of a difference between a first oscillation amplitude and a second oscillation amplitude is greater than or equal to a first threshold; and in response to a determination that the absolute value of the difference between the first oscillation amplitude and the second oscillation amplitude is less than the first threshold, performing a system-level anti-EMS design, and determining whether the failure disappears after performing the system-level anti-EMS design, and if the failure disappears after performing the system-level anti-EMS design, determining that an EMS interference is the source of the failure. A level of the second EMS test is lower than a level of the first EMS test, and the first EMS test and the second EMS test are tests in which test points are applied to system-level ports. The system-level anti-EMS design including the steps of strengthening a structural grounding continuity design of the EMS test point, strengthening a release of interference, or using a shielding design of an interference path. The system-level ports include power interface, communication interface and chassis shell.

In one embodiment, the testing device further comprises: in response to a determination that the absolute value of the difference between the first oscillation amplitude and the second oscillation amplitude is greater than or equal to first threshold, performing a board-level anti-EMS design, and determining whether the failure disappears after performing the board-level anti-EMS design, and if the failure disappears after performing the board-level anti-EMS design, determining that EMS interference is the source of the failure. The board-level anti-EMS design includes interference discharge protection devices being connected in parallel to a known interfered signal, or energy absorption devices being connected in series to a known interfered signal, or using energy isolation devices.

The testing method and testing device of the present disclosure combine the time domain measurement and frequency domain analysis of EMS, distinguishes board-level design and system-level EMS design, clarifies the difference between EMS phenomenon and general product failure phenomenon, and thus improves the ability and efficiency of product failure analysis, efficiency guarantees product quality, thereby improving economic benefits.

It should be noted that, in addition to being applied to servers, the above technical solutions of the present application can be applied to storage, personal computers, notebooks and other devices to perform failure analysis and troubleshooting on storage, personal computers, and notebooks.

Those of ordinary skill in the art can understand that all or part of the steps in the above method can be completed by a program instructing relevant hardware, and the program can be stored in a computer-readable storage medium, such as a read-only memory, a magnetic disk, or an optical disk. Optionally, all or part of the steps of the foregoing embodiments may also be implemented by using one or more integrated circuits. Accordingly, each module/unit in the foregoing embodiments may be implemented in the form of hardware or software functional modules. Form realization. This application is not limited to the combination of any specific form of hardware and software.

The foregoing descriptions are only preferred embodiments of the application, and are not intended to limit the application. For those skilled in the art, the application may have various modifications and changes. Any modification, equivalent replacement, improvement, etc., made within the spirit and principle of this application shall be included in the protection scope of this application.

The invention claimed is:

1. A testing method to determine a problem source of a server failure, the method comprising:
   when a server experiences a failure during use, determining a current suspected problem source; and
   determining whether the server has passed a first EMS (Electro Magnetic Susceptibility) test, and if the server has not passed the first EMS test, performing an operation A;
   the operation A includes:
   a1. performing a second EMS test on the server;
   a2. determining whether the failure disappears during the second EMS test;
   a3. in response to a determination that the failure disappears during the second EMS test, performing a4;
   a4. obtaining a first time domain waveform and a second time domain waveform;
   a5. determining whether the absolute value of the difference between a first oscillation amplitude and a second oscillation amplitude is greater than or equal to a first threshold; and
   a6. if the absolute value of the difference between the first oscillation amplitude and the second oscillation amplitude is less than the first threshold value, performing a system-level anti-EMS design, and determining whether the failure disappears after performing the system-level anti-EMS design, and if the failure disappears after performing the system-level anti-EMS design, determining that an EMS interference is the source of the failure;
   wherein, a level of the second EMS test is lower than a level of the first EMS test, and the first EMS test and the second EMS test are tests in which test points are applied to system-level ports;
   the first time domain waveform and the second time domain waveform are the time domain waveforms obtained in the last two EMS tests performed before comparing with the first threshold from the current suspected problem source; the first oscillation amplitude is the oscillation amplitude of the first time domain waveform, and the second oscillation amplitude is the oscillation amplitude of the second time domain waveform;
   wherein, the system-level anti-EMS design includes the steps of strengthening a structural grounding continuity design of the EMS test point, strengthening release of interference, or using a shielding design of an interference path; and
   wherein, the system-level ports include a power interface, a communication interface and a chassis shell.

2. The method according to claim 1, wherein after the a5, the operation A further comprises:
   a7. if the absolute value of the difference between the first oscillation amplitude and the second oscillation amplitude is greater than or equal to the first threshold, performing a board-level anti-EMS design, and determining whether the failure disappears after performing the board-level anti-EMS design, and if the failure disappears after performing the board-level anti-EMS design, determining that the EMS interference is the source of the failure;
   wherein, the board-level anti-EMS design includes interference discharge protection devices that are connectable in parallel to a known interfered signal, or energy absorption devices that are connectable in series to a known interfered signal, or using energy isolation devices.

3. The method according to claim 2, wherein the method further includes:
   if the failure does not disappear after performing the system-level anti-EMS design, determining that the EMS interference is not a source of the failure; and
   if the failure does not disappear after performing the board-level anti-EMS design, determining that the EMS interference is not the source of the failure.

4. The method according to claim 1, wherein the method further includes:
   if the server has passed the first EMS test, performing a third EMS test on the server, and determining whether the failure is replicated during the third EMS test, and if the failure is replicated during the third EMS test, performing the operation A starting from the a1;
   wherein, a level of the third EMS test is higher than a level of the first EMS test; and the third EMS test is a test in which a test point is applied to a system-level port.

5. The method according to claim 4, wherein the method further includes:
   if the failure is not replicated during the third EMS test, performing a fourth EMS test at the current suspected problem source, and performing an operation B;
   the operation B includes:
   b1. determining whether the failure is replicated during the fourth EMS test currently being performed; and b2. if the failure is replicated during the fourth EMS test currently being performed, performing the operation A starting from the a4;

the fourth EMS test is a non-system level test in which the test point is applied to a board-level port;

wherein, the board-level port includes a connector, a chip, and a circuit.

6. The method according to claim 5, wherein after the b1, the operation B further comprises:

b3. if the failure is not replicated during the fourth EMS test currently being performed, obtaining a third time domain waveform and a fourth time domain waveform;

b4. determining whether the absolute value of the difference between a third oscillation amplitude and a fourth oscillation amplitude is greater than or equal to a second threshold;

b5. if the absolute value of the difference between the third oscillation amplitude and the fourth oscillation amplitude is greater than or equal to the second threshold, determining whether there are other suspected problem sources other than the current suspected problem source; and b6. if there is no other suspected problem source other than the current suspected problem source, determining that the EMS interference is not the source of the failure;

wherein, the third time domain waveform and the fourth time domain waveform are the time domain waveforms obtained in the last two EMS tests performed before comparing with the second threshold from the current suspected problem source; and the third oscillation amplitude is the oscillation amplitude of the third time domain waveform, and the fourth oscillation amplitude is the oscillation amplitude of the fourth time domain waveform, the third oscillation amplitude corresponding to the third time domain waveform is lower than the fourth oscillation amplitude corresponding to the fourth time domain waveform.

7. The method according to claim 6, wherein after the b4, the operation B further includes:

b7. if the absolute value of the difference between the third oscillation amplitude and the fourth oscillation amplitude is less than the second threshold, performing the fourth EMS test again at the current suspected problem source, and performing the operation B starting from the b1.

8. The method according to claim 7, wherein after the b5, the operation B further includes:

b8. if there are other suspected problem sources other than the current suspected problem source, updating the other suspected problem sources as the current suspected problem source, and performing the fourth EMS test at the updated current suspected problem source, and performing the operation B starting from the b1.

9. The method according to claim 8, wherein after the a2, the operation A further includes:

if the failure does not disappear during the second EMS test, performing the operation B starting from the b1;

wherein, a third oscillation amplitude corresponding to the third time domain waveform is lower than a fourth oscillation amplitude corresponding to the fourth time domain waveform.

10. A testing device to determine a problem source of a server failure, the device comprising:
a memory to store a program for testing; and
a processor;

wherein the processor is configured to read and perform the program for testing, and perform the following operations;

when a server experiences a failure during use, determining a current suspected problem source; and determining whether the server has passed a first (Electro Magnetic Susceptibility) EMS test, and if the server has not passed the first EMS test, perform an operation A;

the operation A includes:

a1. performing a second EMS test on the server;

a2. determining whether the failure disappears during the second EMS test;

a3. in response to a determination that the failure disappears during the second EMS test, performing a4;

a4. obtaining a first time domain waveform and a second time domain waveform;

a5. determining whether the absolute value of the difference between a first oscillation amplitude and a second oscillation amplitude is greater than or equal to a first threshold; and a6. if the absolute value of the difference between the first oscillation amplitude and the second oscillation amplitude is less than the first threshold value, performing a system-level anti-EMS design, and determining whether the failure disappears after performing the system-level anti-EMS design, and if the failure disappears after performing the system-level anti-EMS design, determining that an EMS interference is the source of the failure;

wherein, a level of the second EMS test is lower than a level of the first EMS test, and the first EMS test and the second EMS test are tests in which test points are applied to system-level ports;

the first time domain waveform and the second time domain waveform are the time domain waveforms obtained in the last two EMS tests performed before comparing with the first threshold from the current suspected problem source; the first oscillation amplitude is the oscillation amplitude of the first time domain waveform, and the second oscillation amplitude is the oscillation amplitude of the second time domain waveform;

wherein, the system-level anti-EMS design is configured to strengthen a structural grounding continuity design of the EMS test point, strengthen the release of interference, or use a shielding design of an interference path; and wherein the system-level ports include a power interface, a communication interface and a chassis shell.

11. The device according to claim 10, wherein after the a5, the operation A further comprises:

a7. if the absolute value of the difference between the first oscillation amplitude and the second oscillation amplitude is greater than or equal to the first threshold, performing a board-level anti-EMS design, and determining whether the failure disappears after performing the board-level anti-EMS design, and if the failure disappears after performing the board-level anti-EMS design, determining that the EMS interference is the source of the failure;

wherein the board-level anti-EMS design includes interference discharge protection devices being connected in parallel to a known interfered signal, or energy absorption devices being connected in series to a known interfered signal, or using energy isolation devices.

12. The device according to claim 11, wherein the processor is configured to read and perform the program for testing, and perform the following operations:
if the failure does not disappear after performing the system-level anti-EMS design, determining that the EMS interference is not the source of the failure; and
if the failure does not disappear after performing the board-level anti-EMS design, determining that the EMS interference is not the source of the failure.

13. The device according to claim 10, wherein the processor is configured to read and perform the program for testing, and perform the following operations:
if the server has passed the first EMS test, performing a third EMS test on the server, and determining whether the failure is replicated during the third EMS test, and if the failure is replicated during the third EMS test, performing the operation A starting from the a1;
wherein, a level of the third EMS test is higher than a level of the first EMS test; and the third EMS test is a test in which the test point is applies to a system-level port.

14. The device according to claim 13, wherein the processor is configured to read and perform the program for testing, and perform the following operations:
if the failure is not replicated during the third EMS test, performing a fourth EMS test at the current suspected problem source, and performing an operation B;
the operation B includes:
b1. determining whether the failure is replicated during the fourth EMS test currently being performed; and
b2. if the failure is replicated during the fourth EMS test currently being performed, performing the operation A starting from the a4;
the fourth EMS test is a non-system level test in which the test point is applied to a board-level port;
wherein the board-level port includes a connector, a chip, and a circuit.

15. The device according to claim 14, wherein after the b1, the operation B further comprises:
b3. if the failure is not replicated during the fourth EMS test currently being performed, obtaining a third time domain waveform and a fourth time domain waveform;
b4. determining whether the absolute value of the difference between a third oscillation amplitude and a fourth oscillation amplitude is greater than or equal to a second threshold;
b5. if the absolute value of the difference between the third oscillation amplitude and the fourth oscillation amplitude is greater than or equal to the second threshold, determining whether there are other suspected problem sources other than the current suspected problem source; and
b6. if there is no other suspected problem source other than the current suspected problem source, determining that the EMS interference is not the source of the failure;
wherein the third time domain waveform and the fourth time domain waveform are the time domain waveforms obtained in the last two EMS tests performed before comparing with the second threshold from the current suspected problem source; and the third oscillation amplitude is the oscillation amplitude of the third time domain waveform, and the fourth oscillation amplitude is the oscillation amplitude of the fourth time domain waveform, the third oscillation amplitude corresponding to the third time domain waveform is lower than the fourth oscillation amplitude corresponding to the fourth time domain waveform.

16. The device according to claim 15, wherein after the b4, the operation B further comprises:
b7. if the absolute value of the difference between the third oscillation amplitude and the fourth oscillation amplitude is less than the second threshold, performing the fourth EMS test again at the current suspected problem source, and performing the operation B starting from the b1.

17. The device according to claim 16, wherein after the b5, the operation B further comprises:
b8. if there are other suspected problem sources other than the current suspected problem source, updating the other suspected problem sources as the current suspected problem source, and performing the fourth EMS test at the updated current suspected problem source, and performing the operation B starting from the b1.

18. The device according to claim 17, wherein after the a2, the operation A further comprises:
if the failure does not disappear during the second EMS test, performing the operation B starting from the b1;
wherein, the third oscillation amplitude corresponding to the third time domain waveform is lower than the fourth oscillation amplitude corresponding to the fourth time domain waveform.

19. A testing device to determine a problem source of a server failure via one or more Electro Magnetic Susceptibility (EMS) test, comprising:
a memory to store a program for testing;
and a processor configured to run the program stored on the memory to perform the following steps:
receiving a first EMS test result from an EMS testing device in response to the server failure; and
determining whether the server has passed the first EMS test,
in response to a determination that the server has not passed the first EMS test, instructing the EMS testing device to perform a second EMS test on the server;
determining whether the failure disappears during the second EMS test;
in response to a determination that the failure disappears during the second EMS test, obtaining a first time domain waveform and a second time domain waveform, determining whether an absolute value of a difference between a first oscillation amplitude and a second oscillation amplitude is greater than or equal to a first threshold; and
in response to a determination that the absolute value of the difference between the first oscillation amplitude and the second oscillation amplitude is less than the first threshold, performing a system-level anti-EMS design, and determining whether the failure disappears after performing the system-level anti-EMS design, and if the failure disappears after performing the system-level anti-EMS design, determining that an EMS interference is the source of the failure;
wherein, a level of the second EMS test is lower than a level of the first EMS test, and the first EMS test and the second EMS test are tests in which test points are applied to system-level ports; wherein the system-level anti-EMS design including the steps of strengthening a structural grounding continuity design of the EMS test point, strengthening a release of interference, or using a shielding design of an interference path; and
wherein, the system-level ports include power interface, communication interface and chassis shell.

20. The testing device according to claim 19, further comprises:

in response to a determination that the absolute value of the difference between the first oscillation amplitude and the second oscillation amplitude is greater than or equal to the first threshold, performing a board-level anti-EMS design, and determining whether the failure disappears after performing the board-level anti-EMS design, and if the failure disappears after performing the board-level anti-EMS design, determining that the EMS interference is the source of the failure;

wherein, the board-level anti-EMS design includes interference discharge protection devices being connected in parallel to a known interfered signal, or energy absorption devices being connected in series to a known interfered signal, or using energy isolation devices.

* * * * *

UNITED STATES PATENT AND TRADEMARK OFFICE
CERTIFICATE OF CORRECTION

Page 1 of 1

PATENT NO. : 11,263,100 B2
APPLICATION NO. : 17/217308
DATED : March 1, 2022
INVENTOR(S) : Jie Dang It is certified that error appears in the above-identified patent and that said Letters Patent is hereby corrected as shown below:

On the Title Page

After item "(63) Continuation of application PCT/CN2019/098484, filed on Jul. 31, 2019", insert the following:
-- (30) Foreign Application Priority Data
Dec. 28, 2018 (CN) .......... 201811623823.4 --.

Signed and Sealed this
Thirty-first Day of May, 2022

Katherine Kelly Vidal
*Director of the United States Patent and Trademark Office*